(12) United States Patent
Ehrman

(10) Patent No.: US 6,400,287 B1
(45) Date of Patent: Jun. 4, 2002

(54) DATA STRUCTURE FOR CREATING, SCOPING, AND CONVERTING TO UNICODE DATA FROM SINGLE BYTE CHARACTER SETS, DOUBLE BYTE CHARACTER SETS, OR MIXED CHARACTER SETS COMPRISING BOTH SINGLE BYTE AND DOUBLE BYTE CHARACTER SETS

(75) Inventor: John R. Ehrman, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/612,866

(22) Filed: Jul. 10, 2000

(51) Int. Cl.[7] ................................................ H03M 7/00
(52) U.S. Cl. ........................................ 341/55; 707/536
(58) Field of Search ............................. 341/55; 707/536

(56) References Cited

U.S. PATENT DOCUMENTS

| | | | | |
|---|---|---|---|---|
| 5,440,482 A | 8/1995 | Davis | ..................... | 364/419.13 |
| 5,485,373 A | 1/1996 | Davis et al. | ........... | 364/419.13 |
| 5,758,314 A | 5/1998 | McKenna | ....................... | 704/8 |

(List continued on next page.)

FOREIGN PATENT DOCUMENTS

| | | | | |
|---|---|---|---|---|
| EP | 0852037 | 1/1999 | ........... | G06F/17/22 |
| JP | 10260884 | 9/1998 | ........... | G06F/12/00 |
| WO | WO 97/10556 | 3/1997 | ........... | G06F/17/22 |

OTHER PUBLICATIONS

"National Language Support Reference Manual" IBM National Language Design Guide vol. 2, 4th Edition, Aug. 1994.

"National Language Support Bidi Guide", IBM National Language Design Guide vol. 3, 1st Edition, Oct. 1995.

(List continued on next page.)

*Primary Examiner*—Howard L. Williams
(74) *Attorney, Agent, or Firm*—Prentiss W. Johnson

(57) ABSTRACT

A data structure for specifying the types of constants whose character values are to be converted to Unicode; for specifying which code page or pages are used for specifying the character encodings used in the source program for writing the character strings to be converted to Unicode; and that can be used to perform conversions from SBCS, mixed SBCS/DBCS, and pure DBCS character strings to Unicode. A syntax suitable for specifying character data conversion from SBCS, mixed SBCS/DBCS, and pure DBCS representation to Unicode utilizes an extension to the conventional constant subtype notation. In converting the nominal value data to Unicode, currently relevant SBCS and DBCS code pages are used, as specified by three levels or scopes derived from either global options, from local AOPTIONS statement specifications, or from constant-specific modifiers. Global code page specifications apply to the entire source program. These global specifications allow a programmer to declare the source-program code page or code pages just once. These specifications then apply to all constants containing a request for conversion to Unicode. Local code page specifications apply to all subsequent source-program statements. These local specifications allow the programmer to create groups of statements containing Unicode conversion requests, all of which use the same code page or code pages for their source-character encodings. Code page specifications that apply to individual constants allow a detailed level of control over the source data encodings to be used for Unicode conversion. The conversion of source data to Unicode may be implemented inherently to the translator (assembler, compiler, or interpreter) wherein it recognizes and parses the complete syntax of the statement in which the constant or constants is specified, and performs the requested conversion. Alternatively, an external function may be invoked by a variety of source language syntaxes which parses as little or as much of the source statement as its implementation provides, and returns the converted value for inclusion in the generated machine language of the object program. Alternatively, the conversion may be provided by the translator's macro instruction definition facility.

4 Claims, 7 Drawing Sheets

U.S. PATENT DOCUMENTS

| | | | | |
|---|---|---|---|---|
| 5,787,452 A | * | 7/1998 | McKenna | 707/536 |
| 5,793,381 A | | 8/1998 | Edberg et al. | 345/467 |
| 5,832,507 A | | 11/1998 | Harper et al. | 707/200 |
| 5,873,111 A | | 2/1999 | Edberg | 707/536 |
| 5,929,729 A | * | 7/1999 | Herriot | 341/55 |
| 6,049,869 A | * | 4/2000 | Pickhardt et al. | 712/300 |
| 6,055,365 A | * | 4/2000 | Tye | 717/1 |

OTHER PUBLICATIONS

"Language Reference" IBM High Level Assembler for MVS® & VM & VSE, Release 3, $3^{rd}$ Edition, Sep. 1998.

"Programmer's Guide", IBM High Level Assembler for MVS® & VM & VSE, Release 3, $3^{rd}$ Edition, Sep. 1998.

"National Language Support" IBM AS/400e series, Version 4, $2^{nd}$ Edition, Feb. 1998.

"The Unicode Standard Version 3.0", The Unicode Consortium. $2^{nd}$ Printing, Apr. 2000.

"Designing Internatinalized Products" IBM National Language Design Guide, $4^{th}$ Edition, Oct. 1996.

* cited by examiner

```
500 ↘
                Title 'DCU — a macro to generate Unicode constants'
                Macro
        &L      DCU    &A,&Pair=Yes,&CodePage=500
        .*
        .*      Expected argument: an apostrophe-delimited string of one or
        .*      more EBCDIC characters, with paired internal apostrophes and
        .*      ampersands. The pairing is preserved in the output string if
        .*      &Pair=Yes, and is not if &Pair=No.
        .*      Initial limitation: max of 63 characters in quoted argument,
        .*      except for paired characters if &Pair=No.
        .*_____*
        .*      Declare variables used internally                   *
        .*_____*
                LclC   &M(256)         Mapping and validation table
                LclC   &V              Valid EBCDIC characters
                LclC   &R              Result Unicode string
                LclB   &P              True if '& pairs retained in output
                LclA   &J              Counter
                LclA   &N              Temp
        .*_____*
        .*      Validate macro arguments                            *
        .*_____*
                AIf    (N'&SysList gt 0).V1  Check for argument
                MNote  8,'DCU — No argument.'
                MExit
        .*
        .V1     AIf    (N'&SysList lt 2).V2  Check single argument
                MNote  8,'DCU — More than one argument.'
                MExit
        .*
        .V2     AIf    (K'&A ge 3).V3
                MNote  8,'DCU — argument too short, or badly formed.'
                MExit
        .*
        .V3     AIf    ('&A'(1,1) eq '''' and '&A'(K'&A,1) eq '''').V4
                MNote  8,'DCU — argument not properly quoted.'
                MExit
        .*
        .V4     AIf    ('YES' eq (Upper '&Pair')).V5  Check if pairing wanted
                AIf    ('NO' eq (Upper '&Pair')).V6   Check if no pairing
                MNote  8,'DCU — invalid value of &&Pair.'
                MExit
        .*
        .V5     ANop   ,
        &P      SetB   1                      Indicate no pairing of '& in output
        .*
```

Fig. 5

```
.*
.V6     ANop ,
        AIf   ('&CodePage' eq '500').V7   Check code page
        MNote 8,'DCU — Code Page &CodePage not supported yet.'
        MExit
.*
.V7     ANop ,
.*_____*
.*      Arguments validated. Set SBCS and Unicode character sets    *
.*_____*
.VX     ANop ,            Set up mapping table
&J      SetA  &J+1
&M(&J)  SetC  ''          Initialize to null
        AIf   (&J lt 256).VX   Loop for all 256 code points
.*
&V      SetC  '0123456789ABCDEFGHIJKLMNOPQRSTUVWXYZabcdefghijklmnopqrs*
              tuvwxyz_@#$%&&*()-+=,./:;"<>"? '
.*
.*      The following is the conversion table from CCSID 500 to Unicode
.*
&U      SetC  '3031323334353637383941424344454647484 94A4B4C4D4E4F5051 5*
              2535455565758595A616263646566676869 6A6B6C6D6E6F707172737*
              475767778797A5F4023242526262A28292D2B3D2C2E2F3A3B273C3E2*
              23F20'
.*
.*      Note: Conditional-assembly string constants require paired
.*      apostrophes and ampersands; ampersands are not reduced to a
.*      single character internally. Thus, the encoding for & appears
.*      twice in the &U encoding string above.
.*
&J      SetA  1
.*_____*
.*      Build the EBCDIC-to-Unicode mapping table                    *
.*_____*
.VY     ANop
&C      SetC  (Double '&V'(&J,1))  Pick character from valid string
&C      SetC  'C''&C'''            Character in self-defining term
&N      SetA  &C+1                 Convert to numeric
&M(&N)  SetC  '&U'(2*&J-1,2)       Put Unicode digits in mapping table
&J      SetA  &J+1                 Increment &J
        AIf   (&J le K'&V).VY      Set up all valid encodings
```

*Fig. 6*

```
.*_____*
.*      Convert each SBCS argument character to Unicode equivalent   *
.*_____*
&J      SetA   2                    Start after initial apostrophe
.*
.Z      ANop   ,                    Head of translation loop
&C      SetC   '&A'(&J,1)           &J-th character from argument
        AIf    ('&C' ne '''' and '&C' ne '&&'(1,1)).Z1 Is it '& ?
        AIf    (&P).Z1              Have '&, is pairing wanted?
&J      SetA   &J+1                 No pairing, step input by one
.Z1     ANop   ,
&C      SetC   (Double '&C')        Pair '& for self-defining term
&C      SetC   'C''&C'''            Change to arithmetic value
&N      SetA   &C+1                 Convert to numeric
&C      SetC   '&M(&N)'             Get Unicode mapping
        AIf    ('&C' ne '').Z2      Validly mappable if not null
        MNote  4,'DCU — Unknown character at position &J converte*
               d to blank.'
&C      SetC   '20'                 Unicode blank
.*
.Z2     ANop   ,
&R      SetC   '&R.00&C'            Add new character to end
&J      SetA   &J+1
        AIf    (&J lt K'&A).Z       Repeat for all internal characters
.*_____*
.*      Generate the requested Unicode constant                      *
.*_____*
&L      DC     X'&R'
        MEnd
```

*Fig. 7*

DATA STRUCTURE FOR CREATING, SCOPING, AND CONVERTING TO UNICODE DATA FROM SINGLE BYTE CHARACTER SETS, DOUBLE BYTE CHARACTER SETS, OR MIXED CHARACTER SETS COMPRISING BOTH SINGLE BYTE AND DOUBLE BYTE CHARACTER SETS

CROSS-REFERENCE TO RELATED APPLICATIONS

Application Ser. No. 09/613,083, filed concurrently herewith on Jul. 10, 2000 for METHOD OF, SYSTEM FOR, AND COMPUTER PROGRAM PRODUCT FOR CREATING AND CONVERTING TO UNICODE DATA FROM SINGLE BYTE CHARACTER SETS, DOUBLE BYTE CHARACTER SETS, OR MIXED CHARACTER SETS COMPRISING BOTH SINGLE BYTE AND DOUBLE BYTE CHARACTER SETS, currently co-pending, and assigned to the same assignee as the present invention; and Application Ser. No. 09/613,085, filed concurrently herewith on Jul. 10, 2000 for METHOD OF, SYSTEM FOR, AND COMPUTER PROGRAM PRODUCT FOR SCOPING THE CONVERSION OF UNICODE DATA FROM SINGLE BYTE CHARACTER SETS, DOUBLE BYTE CHARACTER SETS, OR MIXED CHARACTER SETS COMPRISING BOTH SINGLE BYTE AND DOUBLE BYTE CHARACTER SETS, currently co-pending, and assigned to the same assignee as the present invention.

The foregoing copending applications are incorporated herein by reference.

A portion of the Disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates in general to coded character sets for representing characters in a computer program, and more particularly to a creation of Unicode characters by converting from non-Unicode characters.

2. Description of the Related Art

Unicode is a new internationally standardized data encoding for character data which allows computers to exchange and process character data in any natural language text. Its most common usage is in representing each character as a sixteen-bit number. This is sometimes called a "double-byte" data representation as a byte contains eight bits.

Most existing computer hardware and software represents specific sets of characters in an eight-bit code, of which ASCII (American National Standard Code for Information Interchange) and EBCDIC (Extended binary-coded decimal interchange code) are typical examples. In such an eight-bit representation (also known as a single-byte representation), the limit of two-hundred-fifty-six (256) unique numeric values imposes a restriction on the set of distinct characters that may be encoded using the two-hundred-fifty-six distinct values. Thus, it is necessary to define different sets of encodings for each desired set of characters.

The chosen set of characters is called a "Character Set". Each member of the character set can be assigned a unique eight-bit numeric value ("Code Point") from the set of the two-hundred-fifty-six distinct values (Code Points). A group of assignments of characters and control function meanings to all available code points is called a "Code Page"; for example, the assignments of characters and meanings to the two-hundred-fifty-six code points (0 through 255) of an 8-bit code set is a Code Page. The combination of a specific set of characters and a specific set of numeric value assignments is called a "Coded Character Set". To distinguish among the many different assignments of characters to codings, each Coded Character set is assigned an individual identification number called a "Coded Character Set ID" (CCSID).

In situations involving ideographic scripts such as Chinese, Japanese, or Korean, a hybrid or mixed representation of characters is sometimes used. Because the number of ideographic characters greatly exceeds the two-hundred-fifty-six possible representations available through the use of an eight-bit encoding, a special sixteen-bit encoding may be used instead. To manage such sixteen-bit representations in computing systems and devices built for eight-bit representations, two special eight-bit character codes are reserved and used in the eight-bit-character byte stream to indicate a change of alphabet representation. Typically, a string of characters will contain eight-bit characters in a single-byte representation. When the first of the two special character codes (commonly called a "Shift-Out" character) is encountered indicating a switch of alphabets, the bytes subsequent to the Shift-Out character are interpreted as double-byte pairs encoded in the special sixteen-bit double-byte encoding. At the end of the double-byte ideographic string, the other special eight-bit character code (commonly called a "Shift-In" character) is inserted to indicate that the following eight-bit bytes are to be interpreted as single-byte characters, as were those characters preceding the "Shift-Out" character. This hybrid representation is sometimes also called a "double-byte character set" (DBCS) representation. When such DBCS strings are mixed with SBCS characters, the representation is sometimes called a "mixed SBCS/DCBS" representation.

Ideographic characters may also be represented as sixteen-bit characters in strings without any SBCS characters other than the special initial "Shift-Out" and final "Shift-In" character codes if they are used in a context where it is known that there are no mixtures of eight-bit characters and sixteen-bit characters. Such usage is sometimes called "pure DBCS". The Shift-Out and Shift-In codes are still required as the text of the remainder of the program may use single-byte encodings.

To illustrate, assume that the "Shift-Out" character is represented by the character '<' and that the "Shift-In" character is represented by the character '>'. Then each of the three representations just described may be written as strings of these forms:

| 'abcDEF' | SBCS string |
| 'AB<wxyz>CD' | mixed SBCS/DBCS string |
| '<wxyz>' | pure DBCS string |

The actual computer storage representation of each of these three character formats would generally be similar to the following representations. For example, the SBCS string would generally appear in storage as follows:

```
              +---+---+---+---+---+---+
'abcDEF'      | a | b | c | D | E | F |
              +---+---+---+---+---+---+
```

Six bytes, one byte per character

The hexadecimal encoding of this string in a standard representation may appear as:

```
+---+---+---+---+---+---+
| 81| 81| 83| C4| C5| C6|
+---+---+---+---+---+---+
```

After translation to Unicode, the same characters may be represented by the following bytes (shown in hexadecimal encoding):

```
+---+---+---+---+---+---+---+---+---+---+---+---+
| 00 61| 00 62| 00 63| 00 44| 00 45| 00 46|
+---+---+---+---+---+---+---+---+---+---+---+---+
```

Twelve bytes, two bytes per character

Similarly, the computer storage representation of a mixed SBCS/DBCS string may generally appear as follows where 'wxyz' represents the four bytes needed to encode the two ideographic DBCS characters between the Shift-Out and Shift-In characters, and the '?' strings indicate the specific encodings assigned to the representations of the DBCS characters:

```
             +---+---+---+---+---+---+---+---+---+---+
'AB<wxyz>CD' | A | B | < | ?? ?? | ?? ?? | > | C | D |
             +---+---+---+---+---+---+---+---+---+---+
```

Ten bytes

The hexadecimal encoding of this string in a standard representation may appear as follows (wherein the Shift-Out and Shift-In characters have encodings X'0E' and X'0F' respectively):

```
+---+---+---+---+---+---+---+---+---+---+
| C1| C2| 0E| ??| ??| ??| ??| 0F| C3| C4|
+---+---+---+---+---+---+---+---+---+---+
```

When translated to Unicode, the same characters may be represented by the these bytes (shown in hexadecimal encoding):

```
+---+---+---+---+---+---+---+---+---+---+---+---+
| 00 41| 00 42| ?? ?? | ?? ?? | 00 43| 00 44|
+---+---+---+---+---+---+---+---+---+---+---+---+
```

Twelve bytes, two bytes per character

Note that the Shift-Out and Shift-In characters have been removed, as they are not necessary in the Unicode representation.

For the third type of character string containing pure DBCS characters, the computer storage representation may appear as follows:

```
          +---+---+---+---+---+---+
'<wxyz>'  | < | ?? ?? | ?? ?? | > |
          +---+---+---+---+---+---+
```

Six bytes

The hexadecimal encoding of this string in a standard representation may appear as follows (wherein the Shift-Out and Shift-In characters have encodings X'0E' and X'0F' respectively):

```
+---+---+---+---+---+---+
| 0E| ??| ??| ??| ??| 0F|
+---+---+---+---+---+---+
```

When translated to Unicode, the same characters would be represented by the these bytes (shown in their hexadecimal encoding):

```
+---+---+---+---+
| ?? ?? | ?? ?? |
+---+---+---+---+
```

Four bytes, two bytes per character

In typical usage, many coded character sets are used to represent the characters of various national languages. As computer applications evolve to support a greater range of national languages, there is a corresponding requirement to encompass a great multiplicity of "alphabets". For example, a software supplier in England may provide an account management program to a French company with a subsidiary in Belgium whose customers include people with names and addresses in Danish, Dutch, French, Flemish, and German alphabets. If the program creates billings or financial summaries, it must also cope with a variety of currency symbols. Using conventional technology, it may be difficult, or even impossible, to accommodate such a variety of alphabets and characters using a single eight-bit coded character set.

In other applications, a program may be required to present messages to its users in any of several selectable national languages (this is often called "internationalization"). Creating the message texts requires that the program's suppliers be able to create the corresponding messages in each of the supported languages, which requires special techniques for handling a multiplicity of character sets in a single application.

Unicode offers a solution to the character encoding problem, by providing a single sixteen-bit representation of the characters used in most applications. However, most existing computer equipment creates, manages, displays, or prints only eight-bit single-byte data representations. In order to simplify the creation of double-byte Unicode data, there is a need for ways to allow computer users to enter their data in customary single-byte, mixed SBCS/DBCS, and pure DBCS formats, and then have it converted automatically to the double-byte Unicode representation.

SUMMARY OF THE INVENTION

The present invention comprises a data structure stored in a computer system for representing characters in a computer program, and more particularly to a creation of Unicode characters by converting from non-Unicode characters.

A preferred embodiment of the present invention provides methods for specifying the types of constants whose character values are to be converted to Unicode; for specifying which code page or pages are used for specifying the character encodings used in the source program for writing the character strings to be converted to Unicode; and that can be used to perform conversions from SBCS, mixed SBCS/DBCS, and pure DBCS character strings to Unicode. A syntax suitable for specifying character data conversion from SBCS, mixed SBCS/DBCS, and pure DBCS representations to Unicode utilizes an extension to the conventional constant subtype notation. In converting the nominal value data to Unicode, currently relevant SBCS and DBCS code pages are used, as specified by three levels or scopes derived from either global options, from local AOPTIONS statement specifications, or from constant-specific modifiers. Global code page specifications apply to the entire source program. These global specifications allow a programmer to declare the source-program code page or code pages just once. These specifications then apply to all constants containing a request for conversion to Unicode. Local code page specifications apply to all subsequent source-program statements. These local specifications allow the programmer to create groups of statements containing Unicode conversion requests, all of which use the same code page or code pages for their source-character encodings. Code page specifications that apply to individual constants allow a very detailed level of control over the source data encodings to be used for Unicode conversion. The conversion of source data to Unicode may be implemented inherently to the translator (assembler, compiler, or interpreter) wherein it recognizes and parses the complete syntax of the statement in which the constant or constants is specified, and performs the requested conversion. Alternatively, an external function may be invoked by a variety of source language syntaxes which parses as little or as much of the source statement as its implementation provides, and returns the converted value for inclusion in the generated machine language of the object program. Alternatively, the conversion may be provided by the translator's macro instruction definition facility.

One aspect of a preferred embodiment of the present invention provides for the specification of the types of constants whose character values are to be converted to Unicode.

Another aspect of a preferred embodiment of the present invention provides for the specification of which code page or pages are used for specifying the character encodings used in the source program for writing the character strings to be converted to Unicode.

Another aspect of a preferred embodiment of the present invention performs conversions from SBCS, mixed SBCS/DBCS, and pure DBCS character strings to Unicode.

Another aspect of a preferred embodiment of the present invention provides a syntax suitable for specifying character data conversion from SBCS, mixed SBCS/DBCS, and pure DBCS representations to Unicode utilizing an extension to the conventional constant subtype notation.

Another aspect of a preferred embodiment of the present invention converts a nominal value data to Unicode using currently relevant SBCS and DBCS code pages as specified by a level or scope.

Another aspect of a preferred embodiment of the present invention provides a global level or scope comprising a global code page specification which applies to an entire source program.

Another aspect of a preferred embodiment of the present invention provides a local level or scope comprising a local code page specification which applies to all subsequent source-program statements.

Another aspect of a preferred embodiment of the present invention provides an individual constant level or scope comprising a code page specification that applies to an individual constant.

A preferred embodiment of the present invention has the advantage of providing ease of Unicode data creation: data can be entered into a program using familiar and customary techniques, and in the user's own language and preferred character sets, without having to know any details of SBCS, DBCS, or Unicode character representations or encodings.

A preferred embodiment of the present invention has the further advantage of providing an ability to handle multiple single-byte and double-byte input data encodings, each specific to a national language or a national alphabet. Such input data may be written in several convenient forms, such as SBCS, mixed SBCS/DBCS, and pure DBCS.

A preferred embodiment of the present invention has the further advantage of providing a variety of scopes for specifying controls over source data representations and encodings, such that the user has complete control over the range of these specifications, ranging from global (applying to all requested conversions in the entire program), local (applying to a range of statements containing data to be converted) to individual or constant-specific (applying to a single instance of data to be converted).

A preferred embodiment of the present invention has the further advantage of providing an open-ended design allowing easy addition of supported character sets, by simply providing additional Mapping Tables for each supported character set, and without any need to modify the internal logic of the translator (assembler, compiler, or interpreter) to be cognizant of such added character sets and tables.

A preferred embodiment of the present invention has the further advantage of having no dependence on operating system environments or run-time conversion services, which may or may not be available in the environment in which character data in the source programs are being converted to Unicode and translated to machine language.

A preferred embodiment of the present invention has the further advantage of providing a special language syntax specifying constants to be converted to Unicode, creating no conflicts with existing applications. This syntax is also a natural and intuitively familiar extension of the existing syntax for specifying character constants.

A preferred embodiment of the present invention has the further advantage of having no need to prepare nor accept programs written using Unicode characters, and no need for special Unicode-enabled input/output devices or mapping software, because of the ease of data creation and the variety of data formats described above.

A preferred embodiment of the present invention has the further advantage of providing an ability to implement conversions in multiple ways to provide flexibility, including implementations in the translator itself ("native" implementation), or by using macro or preprocessor instructions, or by utilizing the translator's support for externally-defined and externally-written functions.

A preferred embodiment of the present invention has the further advantage of providing an ability to support normal sixteen-bit Unicode and Unicode UTF-8 character formats as the results of converting any of the source data formats described above.

BRIEF DESCRIPTION OF THE DRAWINGS

For a more complete understanding of the present invention and the advantages thereof, reference is now made to the Description of the Preferred Embodiment in conjunction with the attached Drawings, in which:

FIGS. 5, 6, and 7 are listings of computer program code which implements the method steps preferred in carrying out a preferred embodiment of the present invention.

DESCRIPTION OF THE PREFERRED EMBODIMENT

Figure 1:
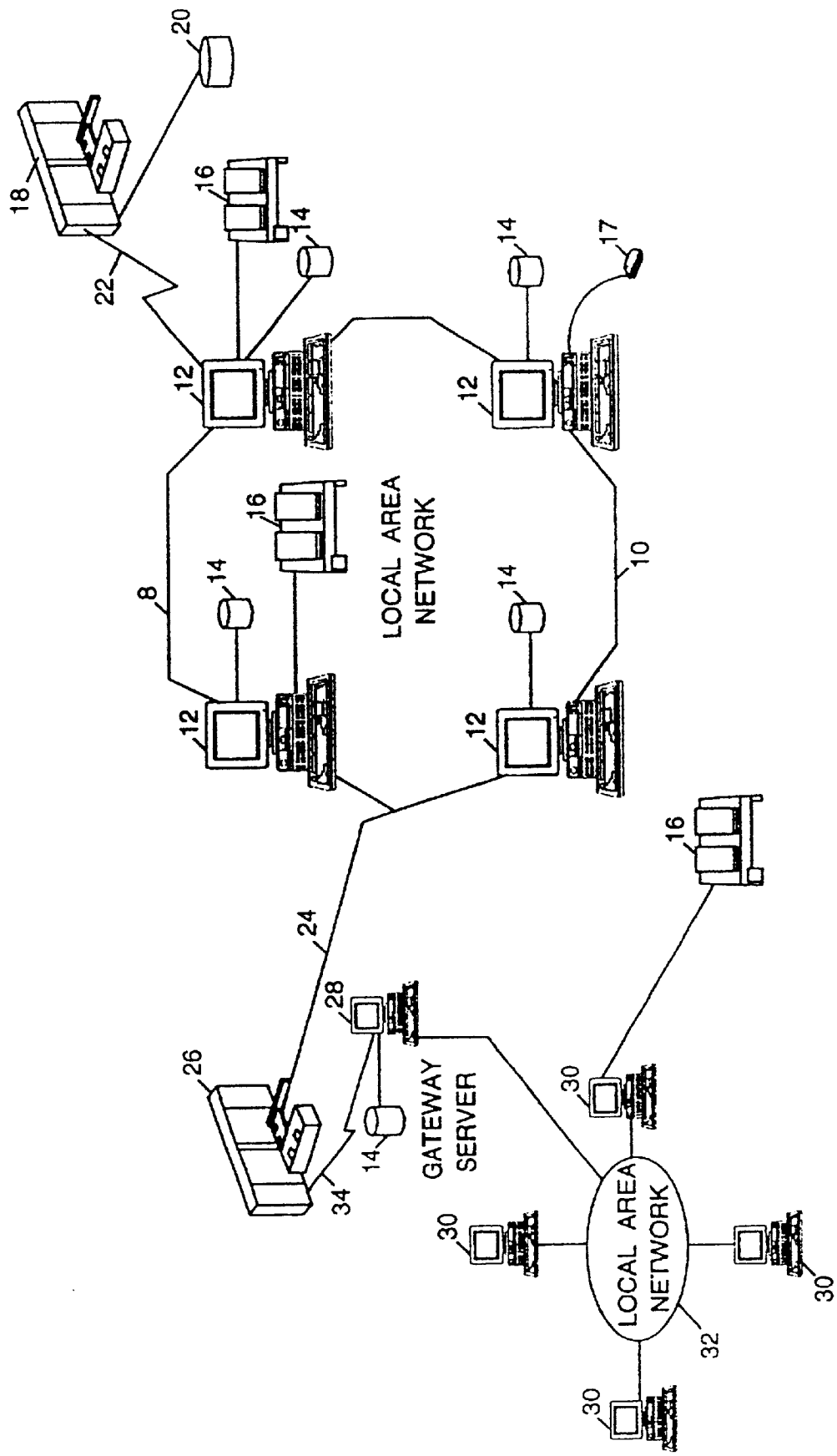
FIG. 1 is a block diagram of a distributed computer system used in performing the method of the present invention, forming part of the apparatus of the present invention, and which may use the article of manufacture comprising a computer-readable storage medium having a computer program embodied in said medium which may cause the computer system to practice the present invention.

Referring first to FIG. 1, there is depicted a graphical representation of a data processing system 8, which may be utilized to implement the present invention. As may be seen, data processing system 8 may include a plurality of networks, such as Local Area Networks (LAN) 10 and 32, each of which preferably includes a plurality of individual computers 12 and 30, respectively. Of course, those skilled in the art will appreciate that a plurality of Intelligent Work Stations (IWS) coupled to a host processor may be utilized for each such network. Each said network may also consist of a plurality of processors coupled via a communications medium, such as shared memory, shared storage, or an interconnection network. As is common in such data processing systems, each individual computer may be coupled to a storage device 14 and/or a printer/output device 16 and may be provided with a pointing device such as a mouse 17.

The data processing system 8 may also include multiple mainframe computers, such as mainframe computer 18, which may be preferably coupled to LAN 10 by means of communications link 22. The mainframe computer 18 may also be coupled to a storage device 20 which may serve as remote storage for LAN 10. Similarly, LAN 10 may be coupled via communications link 24 through a sub-system control unit/communications controller 26 and communications link 34 to a gateway server 28. The gateway server 28 is preferably an IWS which serves to link LAN 32 to LAN 10.

With respect to LAN 32 and LAN 10, a plurality of documents or resource objects may be stored within storage device 20 and controlled by mainframe computer 18, as resource manager or library service for the resource objects thus stored. Of course, those skilled in the art will appreciate that mainframe computer 18 maybe located a great geographic distance from LAN 10 and similarly, LAN 10 may be located a substantial distance from LAN 32. For example, LAN 32 may be located in Belgium while LAN 10 may be located within England and mainframe computer 18 may be located in New York.

Software program code which employs the present invention is typically stored in the memory of a storage device 14 of a stand alone workstation or LAN server from which a developer may access the code for distribution purposes, the software program code may be embodied on any of a variety of known media for use with a data processing system such as a diskette or CD-ROM or may be distributed to users from a memory of one computer system over a network of some type to other computer systems for use by users of such other systems. Such techniques and methods for embodying software code on media and/or distributing software code are well-known and will not be further discussed herein.

As will be appreciated upon reference to the foregoing, it may be desirable for a user to develop a multi-lingual or multi-alphabet software application. For example, a user of a software supplier in England may develop an account management program on a workstation 12 for use on a French company's computer 26 wherein the French company has a subsidiary in Belgium running a computer 28 which must process requests from users operating computers 30, each of which may be interfacing in a different language, such as Danish, Dutch, French, Flemish, or German. The present invention provides character specification and conversion capabilities to accommodate such a variety of alphabets and characters.

The following description of an assembler based preferred embodiment of the present invention assumes familiarity with the assembly language described in "IBM High Level Assembler for MVS & VM & VSE Language Reference, Release 3", IBM Manual Number SC26-4940-02, and the assembler options and external function interfaces described in "IBM High Level Assembler for MVS & VM & VSE Programmer's Guide, Release 3", IBM Manual Number SC26-4941-02. While this preferred embodiment of the present invention is described in the context of the IBM Assembler Language, it can apply to other language translators such as assemblers, compilers, and interpreters.

The invention concerns the creation of Unicode data, not its processing. The invention may be described in three ways:

A. Methods for specifying the types of constants whose character values are to be converted to Unicode;

B. Methods for specifying which code page or pages are used for specifying the character encodings used in the source program for writing the character strings to be converted to Unicode.; and C. Methods that can be used to perform conversions from SBCS, mixed SBCS/DBCS, and pure DBCS character strings to Unicode.

In the following descriptions, the terms "source" or "source string" refer to the characters to be converted to Unicode, and "source code page" refers to the particular encoding used to represent the source-string characters as numeric quantities. Similarly, the terms "target" or "target string" refer to the set of Unicode characters into which the source string is being converted.

Standard Syntax

The terminology of the IBM Assembler Language is used to specify character constants. The DC ("Define Constant") instruction directs the Assembler to convert the characters enclosed in apostrophes specified in the operand field to the proper machine language representation:

| | |
|---|---|
| DC C'...SBCS characters...' | Convert '...SBCS characters...' to the proper machine language representation. |
| DC C'...SBCS and DBCS characters...' | Convert '...SBCS and DBCS characters...' to the proper machine language representation. Requires that the DBCS option be specified. |
| DC G'...pure DBCS characters...' | Convert '...pure DBCS characters...' to the proper machine language representation. |

Requires that the DBCS option be specified.

The DC (Define Constant) statement has this general form:

label DC (DUPLICATION_FACTOR)(TYPE)(MODIFIERS)'(NOMINAL_VALUE)' where the parentheses simply delimit the various fields, and are not part of the syntax of the statement. In general, only the TYPE and NOMINAL_VALUE fields are required. For example, a statement defining a character constant could be written:

DC C'This is a character constant' where the TYPE is indicated by the letter C.

In the general form of the DC statement, each of the parenthesized terms has the following meanings:

1. The optional DUPLICATION_FACTOR field specifies that the constant defined by the following elements should be repeated a specified number of times. For example,

DC 3C'XYZ=' would generate a machine language constant from the character string 'XYZ=XYZ=XYZ=', containing three repetitions of the nominal value string 'XYZ='.

2. TYPE specifies the type of encoding to be created for the values specified in the NOMINAL_VALUE field. In a preferred embodiment of the present invention, types of specific interest and applicability are Types C and G, for "Character" and "Graphic" constants, respectively. Other TYPE values are used to indicate that the NOMINAL_VALUE data should be converted to machine language data representations such as binary integer, floating point, packed decimal, and others as described in the "High Level Assembler Language Reference" citation.

The TYPE specification may also include a "subtype" specification to provide additional refinements in the type of conversion to be performed. For example, the "D" type indicates that the NOMINAL_VALUE is to be converted to an eight-byte floating point representation; two subtypes are supported, such that "DH" indicates conversion to hexadecimal floating point, and "DB" indicates conversion to binary floating point.

3. MODIFIERS specify additional information to be used in creating the generated machine language constant. A preferred embodiment of the invention is primarily concerned with the "Length" modifier, which asserts the exact length required for the generated data. An additional modifier may be used for specifying code pages to be used in converting individual constants.

4. NOMINAL_VALUE is the data to be converted. A preferred embodiment of the present invention is concerned with character data in three forms: SBCS data, mixed SBCS/DBCS data, and pure DBCS data.

Literals

Literals are a convenient form of declaring a constant in the immediate context of its use. For example, to set the address of a character constant into General Purpose Register 2, a programmer may write the "Load Address" (LA) instruction thus:

LA 2,=C'A Character Constant' where the equal sign indicates to the assembler that the following operand is a literal constant. The assembler effectively creates a hidden internal name for the constant, replaces the literal operand in the statement by the internal name, and places the text of a statement defining the constant labeled with the internal name in a designated (or default) place in the program. This saves the programmer from having to write two statements, such as:

LA 2,Char_Const

- - - other statements

Char-Const DC C'A Character Constant'

Literals can easily be supported for all constant types described in this preferred embodiment of the present invention, and will therefore not be discussed further; such support is assumed throughout.

The assembler also supports specialized forms of character-like data called "self-defining terms". These comprise decimal, binary, hexadecimal, character, and graphic (pure DBCS) forms. The values of all self-defining terms are fixed and predefined by the assembler. For example, the self-defining terms 193, B'11000001', X'C1', and C'A' are required to have identical values. For this reason, no dependence on code page specifications can be allowed for character or graphic self-defining terms, as their values would not be fixed.

In the IBM High Level Assembler, the syntactic character set consists of (a) upper-case and lower-case letters;

(b) decimal digits; and (c) the special characters: +−/*., ( )@#_&'=blank.

(d) The syntactically significant alphabetic character "$" ("currency symbol") is not invariant across EBCDIC code pages; the Assembler Language requires it to have encoding X'5B', or 91 decimal.

Other characters are invariant across code pages, but they are not syntactically significant:

;:?"%< >

The invariance or non-invariance of various syntactic characters is not significant to this preferred embodiment of the present invention, other than providing a vehicle for the proper recognition of character strings to be converted to Unicode. The character set used in character data may contain SBCS and DBCS character encodings from many possible code pages without affecting the syntactic or semantic behavior of the program, because the contexts specifying data to be converted to Unicode are limited and well defined.

This preferred embodiment supports the common programming practice that source programs (symbols, operation codes, etc.) are always created using a syntactic character set, which includes those characters needed by the assembler or other programming-language translator to correctly parse and tokenize the elements of the source program, and to identify those program elements specifically requesting conversion to Unicode. Conversion-specific character data appears only in restricted contexts, between the enclosing apostrophes of the CU-type or GU-type constants described below. Text to be converted may therefore be encoded in any desired manner.

Although the preferred embodiment described uses the Extended Binary Coded Decimal Interchange Code (EBCDIC) for all but character data, this invention applies to any conventional character set used for creating programs, such as ASCII.

A. Source Data Specification Extensions for Unicode

A syntax suitable for specifying character data conversion from SBCS, mixed SBCS/DBCS, and pure DBCS representation to Unicode utilizes the constant subtype notation described above. To specify that the nominal value of character data is to be converted to Unicode, a programmer may write:

| | |
|---|---|
| DC CU'...SBCS data...' | Convert SBCS to Unicode |
| DC CU'...SBCS/DBCS data...' | Convert mixed SBCS/DBCS to Unicode Requires DBCS option |
| DC GU'...pure DBCS data...' | Convert pure DBCS data to Unicode Requires DBCS option |

The first of these is called "pure SBCS data" or simply "SBCS data". The second is called "mixed SBCS/DBCS data", or simply "mixed data". The third is called "pure DBCS data".

In the preferred embodiment using the IBM High Level Assembler, the second and third of these examples require that the DBCS option be specified so that mixed SBCS/DBCS data is recognized correctly, but other forms of recognition rules or syntaxes for the nominal value could also be used.

Another language extension provided by the preferred embodiment defines a new constant type specifically for Unicode by assigning a TYPE code 'U'. Thus, a constant to be converted to Unicode may be written:

DC U'Text to be converted' which could be equivalent in other respects to a constant of type C. If this form is chosen, an additional type letter would also have to be assigned to accommodate pure DBCS data, by analogy with the G-type constant. Because the assembler has already assigned a large range of letters for constant types, the method using a 'U' subtype described above is more economical in its use of the available set of type codes.

In converting the nominal value data to Unicode, the assembler uses the currently relevant SBCS and DBCS code pages, as derived from global options or from local AOPTIONS statement specifications, or from constant-specific modifiers, as described below.

As with other character-based data types, no particular data alignment in storage is assumed. However, since Unicode data naturally occurs in two-byte (sixteen-bit) forms, data alignment on two-byte boundaries could easily be supported if processing efficiencies indicate that doing so would be beneficial.

To simplify usage of these new constant types, the syntax of CU-type and GU-type constants preferably should be unchanged from the current language definition for C-type and G-type constants. This allows users who are familiar with existing coding styles and conventions (i.e., the syntax, of C-type and G-type constants) to utilize this invention with minimal additional effort.

B. Methods for Specifying Source Code Pages

There are three levels, or "scopes", at which source code pages can be specified:

1. Global code page specifications that apply to the entire source program: these "global" specifications allow the programmer to declare the source-program code page or code pages just once. These specifications then apply to all constants containing a request for conversion to Unicode.
2. Local code page specifications that apply to all subsequent source-program statements: these "local" specifications allow the programmer to create groups of statements containing Unicode conversion requests, all of which use the same code page or code pages for their source-character encodings. For example, a program might contain statements defining messages in each of several national languages; each grouping could be preceded by such a "local" code page specification that applies to all the statements of that group, until a subsequent local specification is provided that applies to the following group.
3. Individual constant code page specifications that apply to individual constants: these allow a very detailed level of control over the source data encodings to be used for Unicode conversion. For example, if a message in one national language must contain a segment written in a different national language, each segment of the message can specify the encoding used for its characters.

B.1. Global Source Code Page Specification

Global source code specifications apply to all DC ("Define Constant") statements in the source program to which Unicode conversion should be applied. These global specifications would typically be specified as "options" or "parameters" presented to the Assembler at the time it is invoked or initialized, so that the Assembler can set up any needed information that will apply to the entire source program translation.

The forms that such global source code specification options may take include:

| | |
|---|---|
| CODEPAGE(nnn) | specifies a SBCS code page |
| CODEPAGE(nnn,nnn...) | specifies a set of SBCS code pages (Example 1) |
| CODEPAGE(nnn,sss) | specifies a SBCS code page and a DBCS code page |
| DBCS(sss) | specifies a DBCS code page and enables recognition of DBCS data |
| DBCS(sss,sss,...) | specifies a set of DBCS code pages and enable recognition of DBCS data (Example 2) |
| DBCS(CODEPAGE(sss)) | specifies a DBCS code page and enables recognition of DBCS data | and so forth, where values such as nnn and sss are Coded Character Set IDs (CCSIDs). Combinations and variations of the above, as well as abbreviations of the keywords, are equally useful. Default code page values can also be specified at the time the Assembler is installed on the user's system, allowing Unicode translations to be specified in the program without the need for invocation or initialization options.

In addition to these "invocation" options, the preferred embodiment allows the user to specify certain options to be included in the statements of the source program, using the *PROCESS statement. Thus, any of the above option forms could be placed in the source module with a statement like:

*PROCESS CODEPAGE(nnn)

and so forth, for all possible variations. An additional capability is provided with the *PROCESS statement: if the OVERRIDE( . . . ) option is specified, as in:

*PROCESS OVERRIDE(CODEPAGE(nnn))

With the OVERRIDE( . . . ) option, the user can thereby specify that no matter what CODEPAGE options are specified when the Assembler is invoked, the global CODEPAGE value or values cannot be changed from the value(s) required to produce correct conversion of the constants in the source program.

B.2. Local Source Code Page Specification

The IBM High Level Assembler provides a mechanism allowing users to make local adjustments or overrides to options that can also be specified "globally". This mechanism is the ACONTROL statement. For example, if the user wishes that the assembler not diagnose certain substring operations, the user may specify:

ACONTROL FLAG(NOSUBSTR) (Assembler ignores possibly-invalid substring techniques)

- - - statements with unusual substring coding techniques
   - - -

ACONTROL FLAG(SUBSTR) (Assembler resumes checking substring techniques)

The ACONTROL statement can be used to specify localized controls over the source code pages to be used for converting designated forms of character data to Unicode. For example, distinct groups of statements can be converted to Unicode from separate code pages as follows:

ACONTROL CODEPAGE(nnn)
   - - - statements with character data to be converted to
   - - - Unicode using code page with CCSID nnn
   ACONTROL CODEPAGE(mmm)
   - - - statements with character data to be converted to
   - - - Unicode using code page with CCSID mmm Alternatively, if it is desired to specify multiple code pages to be used in converting constants in subsequent statements, the ACONTROL statements could be specified in alternative forms, such as:

.* Example 3
   ACONTROL CODEPAGE(nnn1,nnn2, . . ),DCBS (CODEPAGE(sss1,sss2, . . . ))
   - - - statements with character data to be converted to Unicode
   - - - using code pages selected among the nnn and sss values
   .* Example 4
   ACONTROL CODEPAGE(mmm1,mmm2, . . . ),DBCS (CODEPAGE(ttt1,ttt2, . . . ))
   - - - statements with character data to be converted to Unicode
   - - - using code pages selected among the mmm and ttt values Thus, all the various formats of "global" options could be specified on ACONTROL statements.

In cases where the user wishes to revert from a local source code page specification to the global source code page specification, the following special notation may be used:

ACONTROL CODEPAGE(*) (Revert to global source code page specifications)

Later, conversion and implementation techniques are described that involve methods that do not require direct implementation in the assembler itself, such as macro instructions and external functions. To assist such methods, the assembler can capture information from the options and/or ACONTROL statements in global system variable symbols. These system variable symbols are a method whereby the assembler can provide environmental and status information to macros and functions. In implementing conversion to Unicode data formats, the assembler can capture the designations of current code pages in system variable symbols such as:

| | |
|---|---|
| &SYS_SBCS_CODEPAGE | current SBCS code page |
| &SYS_DBCS_CODEPAGE | current DBCS code page |

The advantages of this increment in assembler capability will be illustrated below.

B.3. Specifying Source Code Page for Individual Constants

The most discriminating level of code page specification is at the level of an individual constant. This invention involves adding a novel modifier, - - P meaning "Code Page" - - , to the existing syntax for specifying constants to provide information about the code page or code pages used to create the source data for the constant.

To provide code page specifications for individual constants, another novel form of modifier is introduced:

DC CUP(nnn)' . . . SBCS data . . . ' which requests that the SBCS data provided using code page "nnn" be converted to Unicode.

DC CUP(nnn,sss)' . . . mixed SBCS/DBCS data . . . ' requests that the mixed SBCS/DBCS data provided using code page "nnn" for the SBCS data and the code page "sss" for the DBCS data be converted to Unicode.

DC GUP(sss)' . . . pure DBCS data . . . ' requests that the pure DBCS data provided using code page "sss" be converted to Unicode.

The above examples demonstrate the use of an explicit numeric specification of the value of the code page modifier. It is common practice in programming languages to use symbolic forms for important numeric quantities; this invention supports this technique. For example, if the statement:

MyCodePage Equ 1148 is used to declare that the symbol "MyCodePage" is equivalent to the value 1148, then the following two statements will be treated identically:

DC CUP(1148)'Text using code page 1148'

DC CUP(MyCodePage)'Text using code page 1148'

Thus, uses of this invention are not limited to strictly numeric specification of CCSIDs in all programming contexts.

For situations where more than one SBCS or DBCS code page is currently available (as exemplified in Examples 1, 2, 3, and 4 above), individual constants could refer indirectly to one of the previously specified code pages using a special "indicator" notation to select the desired code page. For example, suppose the ACONTROL statement of Example 3 immediately preceded these constants:

DC CUP(=1)'Convert this with code page nnn1'

DC CUP(=2)'Convert this with code page nnn2'

The notations "=1" and "=2" are intended to indicate that the first and second code pages declared in the ACONTROL statement should apply to each respective constant. The choice of the "=" character is of course arbitrary, and could be any character not allowed in valid language symbols. This level of constant-specific code page specification could also be used with U-type constants, as described above. Additional modifiers (such as length) can also be supported without any modifications to the existing language rules or implementation within the assembler.

C. Conversion Techniques

Three alternative embodiments for implementing the conversion of source data to Unicode will be described:

1. The implementation is inherent to the assembler itself: the assembler recognizes and parses the complete syntax of the statement in which the constant or constants is specified, and performs the requested conversion.
2. The implementation is provided in the form of an external function that can be invoked by a variety of source language syntaxes. The external function can parse as little or as much of the source statement as its implementation provides, and return the converted value to the assembler for inclusion in the generated machine language of the object program.
3. The implementation is provided by the assembler's macro instruction definition facility. Each of these implementation techniques will be illustrated below.

Mapping Tables

Figure 2:
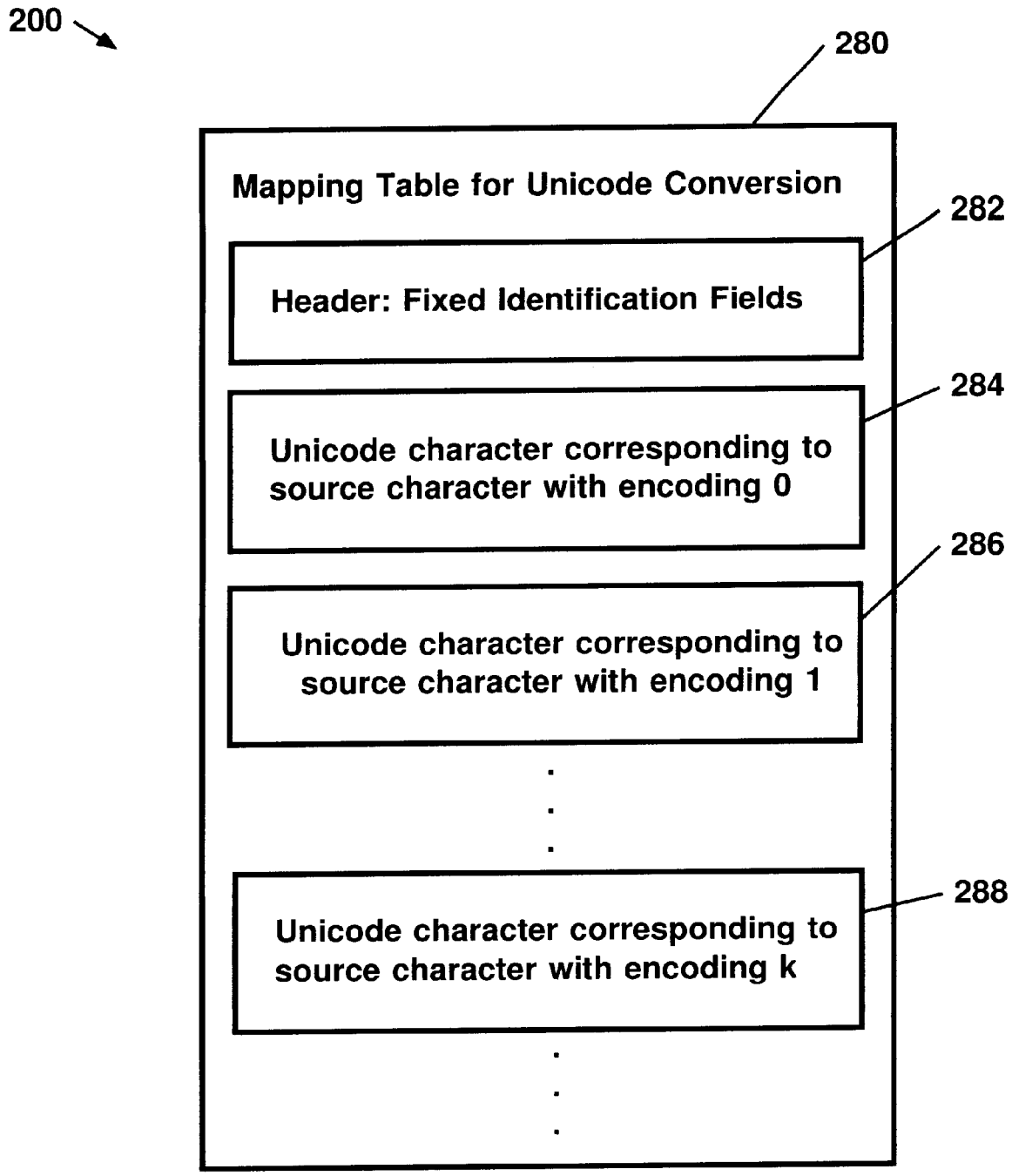
FIG. 2 is a block diagram of a mapping table data structure preferred in carrying out a preferred embodiment of the present invention.

A key element of the conversion process is the Mapping Table. One mapping table is created for each source code page, as identified by its CCSID. Each mapping table contains the Unicode character corresponding to each single-byte or double-byte character in the specified coded character set, arranged in ascending order of the numeric encoding assigned to each source character, as illustrated in FIG. 2.

A Mapping Table 280 typically consists of a fixed-length header 282 containing a number of fields identifying the table and its status, so that the assembler can verify that the correct table is being used for the requested conversion. Following the header are the Unicode characters 284, 286, . . . and 288 in the exact order of the numeric encoding assigned to the corresponding source character.

Thus, the Unicode character corresponding to the source character having a numeric encoding value of 1 would be found at 286. Similarly, the Unicode character corresponding to the source character having a numeric encoding value of k would be found at 288.

A Mapping Table for a SBCS character set would typically have two-hundred-fifty-six Unicode character entries, while a mapping table for a DBCS character set could have as many as sixty-five-thousand-five-hundred-thirty-six (65536) Unicode character entries. If it is known that certain restrictions may be imposed on the range of encoding values permitted for the source characters, then the contents of the mapping tables can be optimized to take advantage of those restrictions. For example, typical DBCS character encodings do not permit assignment of numeric encoding values less than sixteen-thousand-seven-hundred-five (16705), so that mapping table entries would not be necessary for converting those encodings.

Note that for any given constant, either one or two mapping tables will be required for converting the nominal value of the constant to Unicode. For SBCS and pure DBCS data, only a single mapping table is needed; for mixed SBCS/DBCS data, two mapping tables are required: one for the SBCS data and one for the DBCS data.

Table 1 illustrates typical assignments of Coded Character Set IDs (CCSIDs) commonly used for single-byte encodings of character sets in widespread use. Further details may be found in the manual "IBM National Language Design Guide, Volume 2" (manual number SE09-8002-03).

TABLE 1

Examples of CCSIDs for Commonly Used SBCS Character Sets

| SBCS CCSID | DESCRIPTION |
| --- | --- |
| 01140 | USA, Canada, Netherlands, Portugal, Brazil, Australia, New Zealand (00037 with euro) |
| 01141 | Austria, Germany (00273 with euro) |
| 01142 | Denmark, Norway (00277 with euro) |
| 01143 | Finland, Sweden (00278 with euro) |
| 01144 | Italy (00280 with euro) |
| 01145 | Spain, Latin America (Spanish) (00284 with euro) |
| 01146 | United Kingdom (00285 with euro) |
| 01147 | France (00297 with euro) |
| 01148 | Belgium, Switzerland, International Latin-1 (00500 with euro) |

Table 2 shows examples of typical code pages used for DBCS data in pure DBCS or mixed SBCS/DBCS contexts.

TABLE 2

Examples of DBCS Code Pages Suitable for Unicode Conversion

| DBCS CCSID | DESCRIPTION |
| --- | --- |
| 00935 | Simplified Chinese (S-Chinese) Host Mixed (including 1880 UDC and Extended SBCS) |
| 00937 | Traditional Chinese (T-Chinese) Host Mixed (including 6304 UDC and Extended SBCS) |
| 04396 | Japanese Host Double-Byte (including 1880 UDC) (User Definable Characters) |
| 09125 | Korean Host Mixed (including 1880 UDC) |

C.1. Assembler Implementation

To adapt the CCSID of a mapping table to a format usable by internal or operating system services to locate the required mapping table, the assembler can employ a variety of methods. One such technique uses the observation that each CCSID is sixteen bits long, and that its hexadecimal representation therefore contains exactly four hexadecimal digits. For example, CCSID number 01148 is equivalent to the hexadecimal value X'047C'. If those four hexadecimal digits are converted to character form, they can be attached to a standard prefix and used as a module name. For example, in the IBM High Level Assembler, such a module name could be created from a prefix 'ASMA' and a suffix given by the four hexadecimal digits, in this case 'ASMA047C'. This constructed name can then be used as the name of the mapping table in all service requests involving finding and loading the mapping table.

Figure 3:
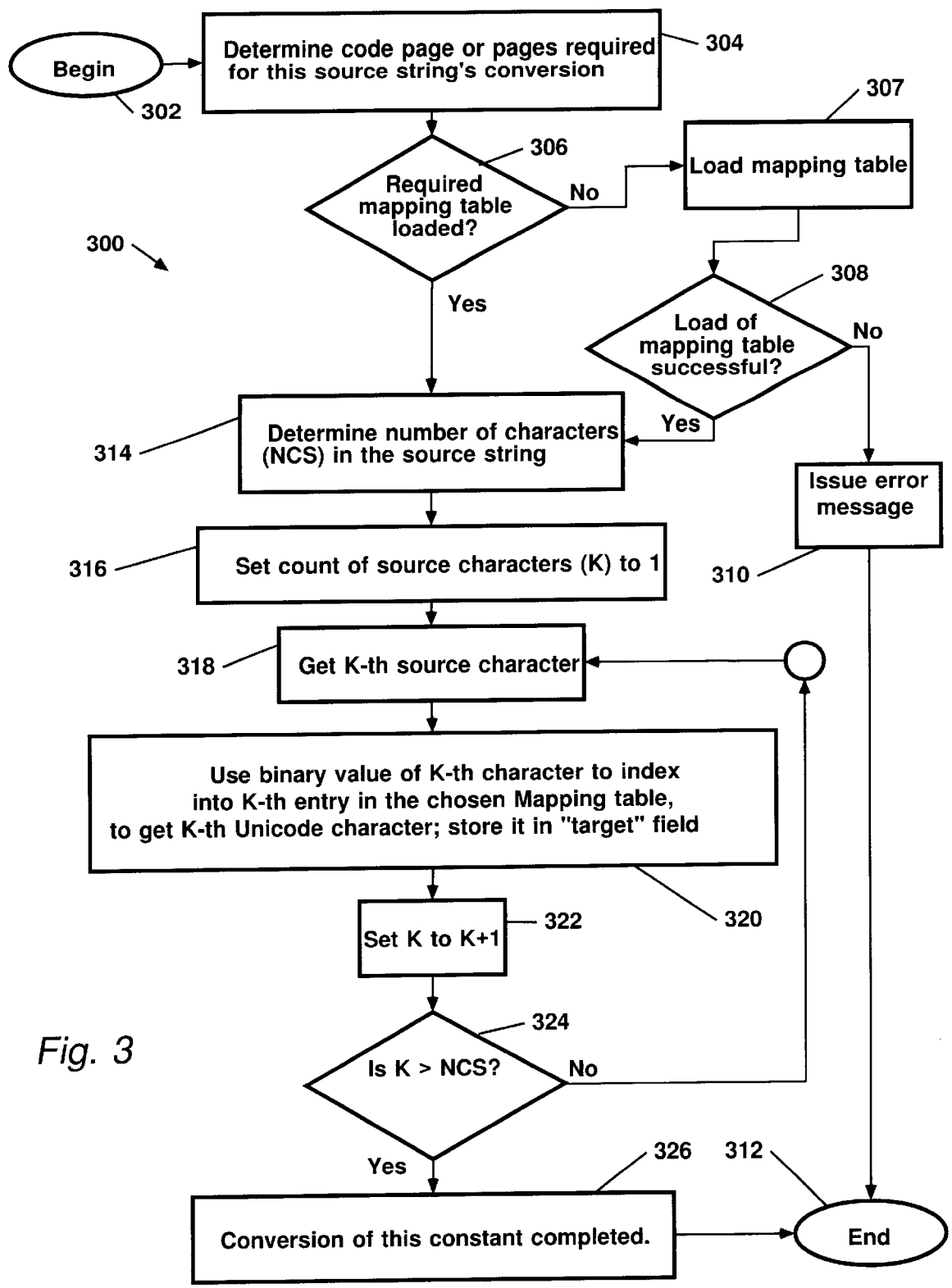
FIG. 3 and FIG. 4 are flowcharts of method steps preferred in carrying out a preferred embodiment of the present invention.
Figure 4:
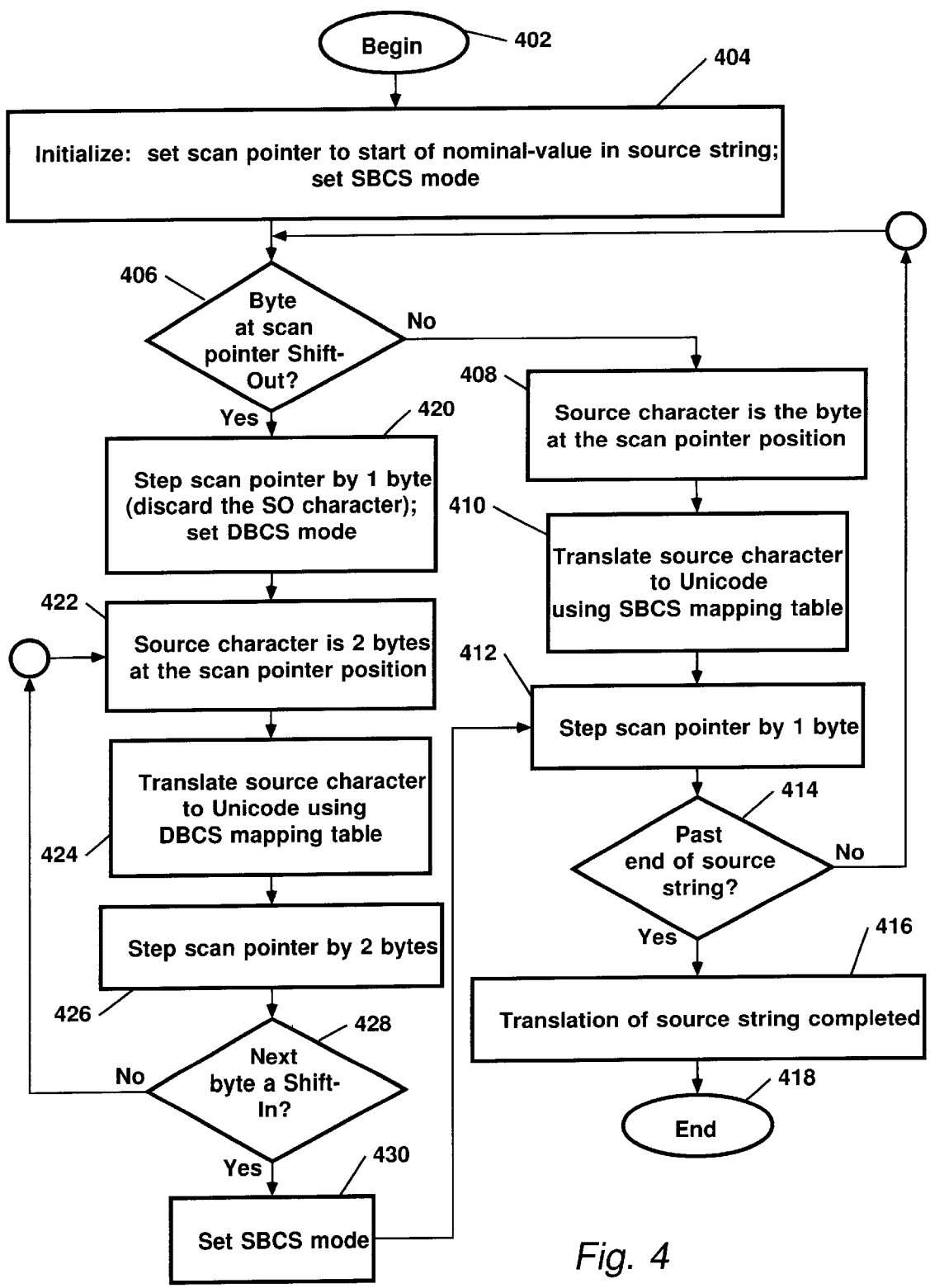

Referring now to FIG. 3 and FIG. 4, the flowcharts illustrate the operations preferred in carrying out the preferred embodiment of the present invention. In the flowcharts, the graphical conventions of a diamond for a test or decision and a rectangle for a process or function are used. These conventions are well understood by those skilled in the art, and the flowcharts are sufficient to enable one of ordinary skill to write code in any suitable computer programming language.

Referring first to FIG. 3, the conversion proceeds as follows. After the start 302 of the conversion program, the assembler establishes at process block 304 the code page or code pages used in the source text for specifying the nominal value of the data to be converted to Unicode. Thereafter, at decision block 306, the assembler determines whether the mapping tables needed for converting source data written in the source-data code pages are currently available. If they are, the assembler proceeds to process block 314 to begin the conversion process. Otherwise, if the mapping tables needed for the conversion are not currently available, then the assembler at process block 307 uses standard operating system services to load the appropriate mapping table. Thereafter, decision block 308 determines if the load of the mapping table was successful. If for any reason the loading process fails, then the assembler at process block 310 issues appropriate error messages and terminates its attempt to convert the constant 312.

Returning now to process block 314, to begin the conversion process the assembler parses the source string to determine the number of characters it contains. These source characters can be SBCS or DBCS characters. The number of these characters is assigned to the variable NCS. Then, at process block 316, the assembler sets a counter "K" for characters from the source string to 1. Thereafter, assembler process block 318 extracts the K-th character from the source string. Using the binary value of the character (which will be an 8-bit value for SBCS characters, and a 16-bit value for DBCS characters), assembler process block 320 extracts the Unicode character from the mapping table that whose position corresponds to that binary value. This extracted value is then stored in the K-th position of the target string, as illustrated in FIG. 2.

After each Unicode character is stored in the target string, assembler process block 322 increases the value of K by one, and its new value is then compared to the number of characters NCS by decision block 324. If the value of K does not exceed the value of NCS, program control is returned to process block 318 to obtain and convert the next source character. If the value of K exceeds the value of NCS, then conversion of the constant is complete, and the Unicode character string is placed in the machine language of the object file for the program by process block 326. Thereafter, the program ends at process block 312.

The process of selecting source-string characters in process steps 316 through 324 of FIG. 3 are described in greater detail in FIG. 4 to show how SBCS and DBCS source characters are selected. The source string is assumed to have previously been validated for syntactic and semantic correctness. After the start 402 of the scanning process, the scanning process is initialized 404 by setting a scan pointer to the address of the first byte of the source string, the nominal value of the constant. Initialization also sets a binary switch to indicate that the scan will proceed initially in "Single-Byte" mode. This switch is also used to determine which Mapping Table (SBCS or DBCS) should be used to translate source characters to Unicode.

Thereafter, the byte pointed to by the scan pointer is checked by decision step 406 to see if it is a "Shift-Out" character, indicating the start of a DBCS string. If the character is not a Shift-Out character, program control proceeds to process step 408 which determines that the source characters are part of an SBCS character set. Process step 408 also uses the source character pointed to by the scan pointer as the index into the SBCS Mapping Table, as indicated in process step 320 of FIG. 3, to perform the translation of process step 410 which translates the source character to Unicode. Thereafter, process step 412 increments the scan pointer by one byte to point to the next byte of the source string. Decision step 414 then determines if the scan pointer now points past the end of the source string. If the scan pointer now points past the end of the source string, then the translation is complete, process step 416, and the assembler resumes normal statement processing, process step 418.

Returning now to decision step 406, if the byte pointed to by the scan pointer is a "Shift-Out" character, then control proceeds to process step 420 which increments the scan pointer by one byte, effectively discarding the "Shift-Out" character. The binary switch described at process step 404 is also set by process step 420 to indicate DBCS mode, thereby allowing selection of the current DBCS Mapping Table to perform the translation as illustrated in FIGS. 2 and 3. Thereafter, process step 422 uses the two bytes pointed to by the scan pointer as the source character. Process step 424 then translates this source character to Unicode using the DBCS Mapping Table. After the translation of the DBCS two-byte character, control proceeds to process step 426 which increments the scan pointer by two bytes to step over the DBCS source character just translated. Decision step 428 tests the following byte to determine if it is a "Shift-In" character, which would indicate the end of the DBCS portion of the source string. If the tested byte is not a "Shift-In" character, then program control returns to process step 422 to process the next DBCS source character. Otherwise, if the byte tested by decision step 428 is a "Shift-In" character, then program control proceeds to process step 430 which resets the binary switch to indicate that SBCS mode is now active. Thereafter, program control passes to the previously described process step 412 which increments the scan pointer by one byte, effectively discarding the "Shift-In" character.

C.1.1. Length Modifiers

The Length modifier is supported by the assembler for most constant types. For character constants, it is written in the form:

DC CL(m)'This is a Character Constant' where the generated machine language object code for the constant is required to have length exactly "m" bytes. This means that the character string in the nominal value field could either be truncated (if m is smaller than the length of the nominal value string), or padded on the right with blanks (if m is larger than the length of the nominal value string). In the case of Unicode constants the implementation may or may not require that any length modifiers of the form:

DC CUL(m)' . . . '

DC GUL(m)'<. . . >' must evaluate to even values of "m". If "m" is odd (indicating that a Unicode character does not contain the expected 16 bits), a diagnostic may be given and corrective action may be taken.

C.2. Implementation Using Macro Instructions

Many assembler programs support some form of "macro-instruction" capability that allows the programmer to create new capabilities whose invocations resemble ordinary instructions.

C.2.1. Macro Instruction to Perform Basic Checking

The most trivial level of Unicode support could be a macro instruction whose argument is a character string of hexadecimal digits, in which the user has manually encoded the representation of each Unicode character. The primary function of such a macro could be validate that the argument string contains a multiple of four hexadecimal digits corresponding to an integral number of Unicode characters, and that each group of four hexadecimal digits corresponds to a true Unicode character. For example, a DCUX macro instruction could be written such that the user might write:

DCUX X' . . . hex data . . . ' or

DCUX ' . . . hex data . . . ' or

DCUX . . . hex_data . . .

and the macro could verify that the number of hexadecimal digits is a multiple of 4, and that the Unicode characters are valid.

C.2.2. Macro Instruction to Perform Checking and Conversion

A more powerful technique for supporting the conversion of character data to Unicode characters is to create a macro definition with internal logic that performs a mapping similar to that illustrated in FIGS. 3 and 4. Implementation of such a macro definition could also include any needed mapping tables within the body of the definition.

An advantage of using macro instructions is that they utilize the existing facilities of the assembler, and therefore do not require changes to the internal operation of the assembler. Their primary disadvantage is that macro definitions must be executed interpretively when invoked, so they are slower than the same function implemented "natively" in the internal logic of the assembler. They also require extra coding for each additional code page being supported. Thus, macro instructions provide an excellent means for testing and validating conversion concepts, as well as a rapid development tool for situations where generality and speed are not critical.

In a typical implementation, a macro instruction would be defined in such a way that its arguments include a character string to be converted to Unicode, and an implicit indication (using the system variable symbols described above) or explicit indication (by providing a descriptive argument) of the CCSID of the code page in which the character string is represented. The macro instruction would then generate directly the machine language constant containing the Unicode data.

There are many ways to use macros for Unicode conversions. To illustrate, suppose the following syntax is defined:

DCU ' . . . character data . . . ',CODEPAGE=nnn,DBCS=sss where the three operands have these meanings:

1. The first operand, ' . . . character data . . . ', consists of the character data to be converted to Unicode, enclosed in quotation marks recognizable by the macro processor.
2. The second operand, CODEPAGE=nnn, specifies the SBCS code page used for encoding the first operand. If omitted, this operand would imply a default value for the code page.
3. The third operand, if present, indicates that the first operand contains either mixed SBCS/DBCS or pure DBCS data, and provides the code page in which the DBCS data is encoded. If omitted, this operand would imply that the first operand contains only SBCS data.

An implementation of such a macro instruction which may be used to create Unicode character constants is illustrated in FIGS. 5, 6, and 7. It does not support the third operand described above, but is intended to illustrate how a macro instruction can be used for Unicode conversions. The macro uses the default code page with CCSID 500, the same as that used by the assembler for its syntactic character set plus other invariant characters. Extending the macro to accept other code pages is straightforward.

C.3. Implementation Using External Functions

The High Level Assembler supports a powerful capability for calling externally-provided functions that can perform a variety of processing operations. Using an external function requires defining the function in such a way that the assembler can locate and call it during the assembly process, passing data supplied by the program to the function, and receiving values returned by the function. In the context of converting character data to Unicode, a call to such a function could take a form such as the following:

&Returned_Val SetCF 'Ext_Func','character data', 'other_parameters'

The symbol "&Returned_Val" is where the called function "Ext_Func" places its computed value as calculated from the other arguments. These arguments would typically include the character string to be converted to Unicode, the code page or code pages used in coding the character data, and any other values that might be useful to the external function. In practice, the returned value would normally be substituted into a character or hexadecimal constant, which the assembler would then map directly into the machine language form of the Unicode constant.

An external function has much of the flexibility of the assembler itself: it can access mapping tables as needed, as well as any other services of the operating system environment in which the assembler itself is executing. Any error conditions can be reported to the assembler using a message passing interface.

Further implementations of Unicode conversions could use a mixture of macro instructions and external functions, in such a way that the user writes a statement such as the following:

DCUNI ' . . . character data . . . ',CODEPAGE=37 and the macro instruction could then pass the character data, the code page CCSID, and any other useful or necessary information to an external function to perform the required conversion. It could also generate the character or hexadecimal constant directly, in such a way that the above DCUNI instruction appears to be "native" to the assembler itself. Other implementations using external functions are of course possible.

UTF-8 is a special version of the Unicode representation, chosen for its suitability for transmission over communication protocols designed for eight-bit characters. These protocols are sensitive to specific eight-bit codes (such as control characters) that could appear in a stream of valid sixteen-bit Unicode characters, and the transmission of normal Unicode data would very likely be distorted. To avoid this problem, the Unicode standard defines UTF-8 as a reversible mapping of sixteen-bit Unicode characters to a special string of one to four eight-bit bytes, such that none of the eight-bit bytes have special meanings to transmission protocols.

The assembler could easily provide conversion of SBCS, mixed SBCS/DBCS, and pure DBCS data to the UTF-8 representation, thus avoiding the need for possibly expensive run-time conversions for each item of Unicode data being transmitted. In terms of the previous discussion:

1. Specification of a request for UTF-8 conversion can be provided globally, using an assembler option such as UTF8, or an operand on a *PROCESS statement such as:

*PROCESS UTF8

2. Specification of a request for UTF-8 conversion can be provided locally, using an operand of the ACONTROL statement, such as:

ACONTROL UTF8

3. Specification of a request for UTF-8 for an individual constant can be provided by a modifier, such as:

DC CUTF8'Characters to be converted to UTF-8'

Thus, it can be seen that all of the methods described above for specifying the scope of conversion to Unicode can be applied to the requirements for conversion to the UTF-8 representation. It should be noted that UTF-8 data is not required to occupy an even number of eight-bit bytes, so that possible checks and diagnostics for an even number of bytes would not apply. However, in situations where a length modifier causes improper truncation of a UTF-8 byte string, a diagnostic would be appropriate.

Using the foregoing specification, the invention may be implemented using standard programming and/or engineering techniques using computer programming software, firmware, hardware or any combination or sub-combination thereof. Any such resulting program(s), having computer readable program code means, may be embodied within one or more computer usable media such as fixed (hard) drives, disk, diskettes, optical disks, magnetic tape, semiconductor memories such as Read-Only Memory (ROM), Programmable Read-Only Memory (PROM), etc., or any memory or transmitting device, thereby making a computer program product, i.e., an article of manufacture, according to the invention. The article of manufacture containing the computer programming code may be made and/or used by executing the code directly or indirectly from one medium, by copying the code from one medium to another medium, or by transmitting the code over a network. An apparatus for making, using, or selling the invention may be one or more processing systems including, but not limited to, central processing unit (CPU), memory, storage devices, communication links, communication devices, servers, input/output (I/O) devices, or any sub-components or individual parts of one or more processing systems, including software, firmware, hardware or any combination or sub-combination thereof, which embody the invention as set forth in the claims. User input may be received from the keyboard, mouse, pen, voice, touch screen, or any other means by which a human can input data to a computer, including through other programs such as application programs, databases, data sets, or files.

One skilled in the art of computer science will easily be able to combine the software created as described with appropriate general purpose or special purpose computer hardware to create a computer system and/or computer sub-components embodying the invention and to create a computer system and/or computer sub-components for carrying out the method of the invention. Although the present invention has been particularly shown and described with reference to a preferred embodiment, it should be apparent that modifications and adaptations to that embodiment may occur to one skilled in the art without departing from the spirit or scope of the present invention as set forth in the following claims.

I claim:

1. A data structure embodied in a computer-readable storage medium, said data structure representing information describing a character, said data structure comprising:

a non-Unicode data structure containing a representation of a character string;

a code page data structure containing an identification of a code page in which the non-Unicode character string is encoded;

a mapping data structure containing a mapping table mapping a plurality of Unicode characters to corresponding to non-Unicode characters;

a Unicode data structure containing a representation of a Unicode character string resulting from a translation of the non-Unicode character string into the Unicode character string by use of the mapping table; and a scope data structure containing a specification of a scope, the scope specifying a portion of a computer program subject to the translation.

2. The data structure of claim 1 wherein the scope is global, the global scope specifying that the translation applies to the entire computer program.

3. The data structure of claim 1 wherein the scope is local, the local scope specifying that the translation applies the subsequent portion of the computer program.

4. The data structure of claim 1 wherein the scope is constant specific, the constant specific scope specifying that the translation applies only to a specific constant.

\* \* \* \* \*